(12) United States Patent
Flachowsky et al.

(10) Patent No.: US 9,966,466 B2
(45) Date of Patent: May 8, 2018

(54) SEMICONDUCTOR-ON-INSULATOR WAFER, SEMICONDUCTOR STRUCTURE INCLUDING A TRANSISTOR, AND METHODS FOR THE FORMATION AND OPERATION THEREOF

(71) Applicant: GLOBALFOUNDRIES Inc., Grand Cayman (KY)

(72) Inventors: Stefan Flachowsky, Dresden (DE); Ralf Illgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/231,105

(22) Filed: Aug. 8, 2016

(65) Prior Publication Data

US 2018/0040731 A1    Feb. 8, 2018

(51) Int. Cl.
| | |
|---|---|
| H01L 21/02 | (2006.01) |
| H01L 29/78 | (2006.01) |
| H01L 21/28 | (2006.01) |
| H01L 21/762 | (2006.01) |
| H01L 21/324 | (2006.01) |
| H01L 29/66 | (2006.01) |
| H01L 29/786 | (2006.01) |

(52) U.S. Cl.
CPC .... *H01L 29/7849* (2013.01); *H01L 21/02181* (2013.01); *H01L 21/02356* (2013.01); *H01L 21/28291* (2013.01); *H01L 21/324* (2013.01); *H01L 21/76254* (2013.01); *H01L 29/66742* (2013.01); *H01L 29/78654* (2013.01)

(58) Field of Classification Search
CPC ........... H01L 29/7849; H01L 29/66742; H01L 29/78654; H01L 21/02181; H01L 21/02356; H01L 21/28291; H01L 21/324; H01L 21/76254
See application file for complete search history.

(56) References Cited

U.S. PATENT DOCUMENTS

| 5,872,372 A | 2/1999 | Lee et al. |
| 6,222,756 B1 * | 4/2001 | Lee .......................... G11C 11/22 |
| | | 257/E21.208 |

(Continued)

*Primary Examiner* — Victor A Mandala
*Assistant Examiner* — Colleen E Snow
(74) *Attorney, Agent, or Firm* — Amerson Law Firm, PLLC

(57) ABSTRACT

A semiconductor-on-insulator wafer includes a support substrate, an electrically insulating layer over the support substrate and a semiconductor layer over the electrically insulating layer. A semiconductor structure includes a transistor. The transistor includes an electrically insulating layer including a piezoelectric material over a support substrate, a semiconductor layer over the electrically insulating layer, a source region, a channel region and a drain region in the semiconductor layer, a gate structure over the channel region, a first electrode and a second electrode. The first electrode and the second electrode are provided at laterally opposite sides of the electrically insulating layer. The first and second electrodes are electrically insulated from the semiconductor layer and configured for applying a voltage to the piezoelectric material of the electrically insulating layer. The piezoelectric material creates a strain at least in the channel region in response to the voltage applied thereto.

26 Claims, 9 Drawing Sheets

(56) References Cited

U.S. PATENT DOCUMENTS

| | | | |
|---|---|---|---|
| 2008/0121955 A1* | 5/2008 | Shieh | B82Y 10/00 |
| | | | 257/295 |
| 2010/0176371 A1* | 7/2010 | Lochtefeld | H01L 21/02381 |
| | | | 257/13 |
| 2010/0328984 A1 | 12/2010 | Elmegreen et al. | |
| 2012/0033478 A1* | 2/2012 | Kang | H01L 21/28291 |
| | | | 365/145 |
| 2014/0112051 A1* | 4/2014 | Kaneko | H03K 19/21 |
| | | | 365/145 |
| 2015/0214322 A1* | 7/2015 | Mueller | G11C 11/22 |
| | | | 257/295 |

* cited by examiner

SEMICONDUCTOR-ON-INSULATOR WAFER, SEMICONDUCTOR STRUCTURE INCLUDING A TRANSISTOR, AND METHODS FOR THE FORMATION AND OPERATION THEREOF

BACKGROUND OF THE INVENTION

1. Field of the Invention

Generally, the present disclosure relates to integrated circuits, methods for the formation thereof and methods for operating transistors in integrated circuits, and, more particularly, to integrated circuits wherein a strain is provided in channel regions of field effect transistors, methods for the formation of such integrated circuits and methods for operating field effect transistors in such integrated circuits.

2. Description of the Related Art

Integrated circuits include a large number of circuit elements, which include, in particular, field effect transistors. In a field effect transistor, a gate structure including a gate electrode and a gate insulation layer may be provided, wherein the gate insulation layer separates the gate electrode from a channel region and provides an electrical insulation between the gate electrode and the channel region. Adjacent the channel region, a source region and a drain region may be provided. The source region, the drain region and the channel region may be provided in a semiconductor material, wherein the source region and the drain region are doped differently than the channel region. In P-channel transistors, the source and drain regions may be P-doped and the channel region may be N-doped or substantially undoped. In N-channel transistors, the source region and the drain region may be N-doped and the channel region may be P-doped or substantially undoped.

Depending on a gate voltage that it applied between the gate electrode and the source region, a field effect transistor can be switched between an ON-state, wherein there is a relatively high conductance between the source region and the drain region, and an OFF-state, wherein there is a relatively low conductance between the source region and the drain region. The conductance of the channel region in the ON-state of the field effect transistor may depend on, among other things, the dopant concentration in the channel region, the mobility of charge carriers in the channel region, the extension of the channel region in the width direction of the transistor and on the distance between the source region and the drain region, which is commonly denoted as "channel length."

For increasing the conductance of the channel region in the ON-state of the transistor, it has been proposed to improve the mobility of charge carriers in the channel region by modifying the lattice structure of the semiconductor material wherein the channel region is formed. This can be done by creating a tensile or compressive stress in the channel region. A compressive stress in the channel region can create a compressive strain wherein the crystal lattice of the semiconductor material in the channel region is deformed such that the mobility of holes is improved, leading to an increase of the conductivity of the channel region of P-channel transistors. Conversely, a tensile stress in the channel region can create a tensile strain wherein the crystal lattice of the semiconductor material in the channel region is deformed such that the mobility of electrons is increased, which can improve the conductivity of the channel region of N-channel transistors.

For providing stress in the channel regions of field effect transistors, it has been proposed to form stress-creating regions including a semiconductor material having a lattice constant different from the lattice constant of silicon, such as, for example, silicon germanium and/or silicon carbide, adjacent the channel regions. Other techniques for creating stress include providing a semiconductor material having a lattice constant different from the lattice constant of silicon at the channel regions of the transistors. Additionally and/or alternatively, a layer of stressed electrically insulating material, for example, stressed silicon nitride, may be formed over the transistors, and stress memorization techniques wherein silicon is amorphized by ion implantation and re-crystallized in the presence of the layer of stressed electrically insulating material may be performed.

Further techniques that may be used include strained silicon-on-insulator technology. In strained silicon-on-insulator technology, a silicon germanium layer may be provided over a silicon wafer, and a layer of substantially pure silicon may be formed over the silicon germanium layer. Due to the difference between the lattice constants of substantially pure silicon and silicon germanium, a strain can be obtained in the layer of substantially pure silicon. Thereafter, the strained layer of substantially pure silicon can be transferred to a support wafer using techniques of ion implantation, wafer bonding and splitting. A layer of silicon dioxide may be provided between the strained layer of substantially pure silicon and the support wafer so that a silicon-on-insulator structure is obtained. Residues of silicon germanium may be removed from the transferred strained layer of substantially pure silicon by means of an etch process. The transferred strained layer of substantially pure silicon can substantially maintain its strain. Thereafter, transistors may be formed, wherein channel regions of the transistors may be provided in the strained layer of substantially pure silicon.

Techniques for forming stressed channel regions of field effect transistors as described above can have issues associated therewith. Some techniques for forming stressed channel regions can yield an insufficient strain in the channel regions when used in semiconductor manufacturing techniques according to advanced technology nodes. Moreover, strained silicon-on-insulator techniques can provide only one type of strain (tensile or compressive) in each wafer, which may be less than optimal in complementary metal oxide semiconductor (CMOS) techniques wherein both N-channel transistors and P-channel transistors are employed since, as described above, N-channel transistors and P-channel transistors can benefit from different strain.

The present disclosure provides techniques that may help to substantially overcome or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor-on-insulator wafer disclosed herein includes a support substrate, an electrically insulating layer over the support substrate and a semiconductor layer over the electrically insulating layer. The electrically insulating layer includes a piezoelectric material.

An illustrative method disclosed herein includes providing a first wafer and a second wafer. An electrically insulating layer is formed over the first wafer. The electrically insulating layer includes a layer of a material that is suitable for forming a piezoelectric layer. Ions are implanted into a portion of the first wafer below the electrically insulating layer. The implantation of ions defines a splitting position of the first wafer. The first wafer is bonded to the second wafer, wherein the electrically insulating layer is arranged between the first wafer and the second wafer. The first wafer is split at the splitting position of the first wafer. A portion of a semiconductor material of the first wafer that remains bonded to the second wafer provides a semiconductor layer at a side of the electrically insulating layer opposite the second wafer. A piezoelectric layer between the semiconductor layer and the second wafer is formed on the basis of the layer of the material suitable for forming the piezoelectric layer.

An illustrative semiconductor structure disclosed herein includes a transistor. The transistor includes an electrically insulating layer including a piezoelectric material over a support substrate, a semiconductor layer over the electrically insulating layer, a source region, a channel region and a drain region in the semiconductor layer, a gate structure over the channel region, a first electrode and a second electrode. The first electrode and the second electrode are provided at laterally opposite sides of the electrically insulating layer. The first and second electrodes are electrically insulated from the semiconductor layer and configured for applying a voltage to the piezoelectric material of the electrically insulating layer. The piezoelectric material creates a strain at least in the channel region in response to the voltage applied thereto.

Another illustrative method disclosed herein includes providing a semiconductor-on-insulator wafer. The semiconductor-on-insulator wafer includes a support substrate, an electrically insulating layer over the support substrate and a semiconductor layer over the electrically insulating layer. The electrically insulating layer includes a layer of a piezoelectric material. A trench isolation structure including a first trench and a second trench is formed. A gate structure is formed between the first trench and the second trench. First and second portions of the electrically insulating layer and the semiconductor layer are removed. The first portions of the electrically insulating layer and the semiconductor layer are at a side of the first trench opposite the gate structure. The removal of the first portions of the electrically insulating layer and the semiconductor layer forms a first recess. The second portions of the electrically insulating layer and the semiconductor layer are at a side of the second trench opposite the gate structure. The removal of the second portions of the electrically insulating layer and the semiconductor layer forms a second recess. A first electrode is formed in the first recess. A second electrode is formed in the second recess.

A further illustrative method disclosed herein includes providing a semiconductor structure including a transistor. The transistor includes an electrically insulating layer including a piezoelectric material over a support substrate, a semiconductor layer over the electrically insulating layer, a source region, a channel region and a drain region in the semiconductor layer, a gate structure over the channel region, a first electrode and a second electrode. The first and second electrodes are provided at laterally opposite sides of the electrically insulating layer and are electrically insulated from the semiconductor layer. The method further includes applying a voltage between the first electrode and the second electrode. The piezoelectric material creates a strain at least in the channel region in response to the voltage. The strain in the channel region modifies a charge carrier mobility in the channel region.

BRIEF DESCRIPTION OF THE DRAWINGS

The disclosure may be understood by reference to the following description taken in conjunction with the accompanying drawings, in which like reference numerals identify like elements, and in which.

Figure 1:
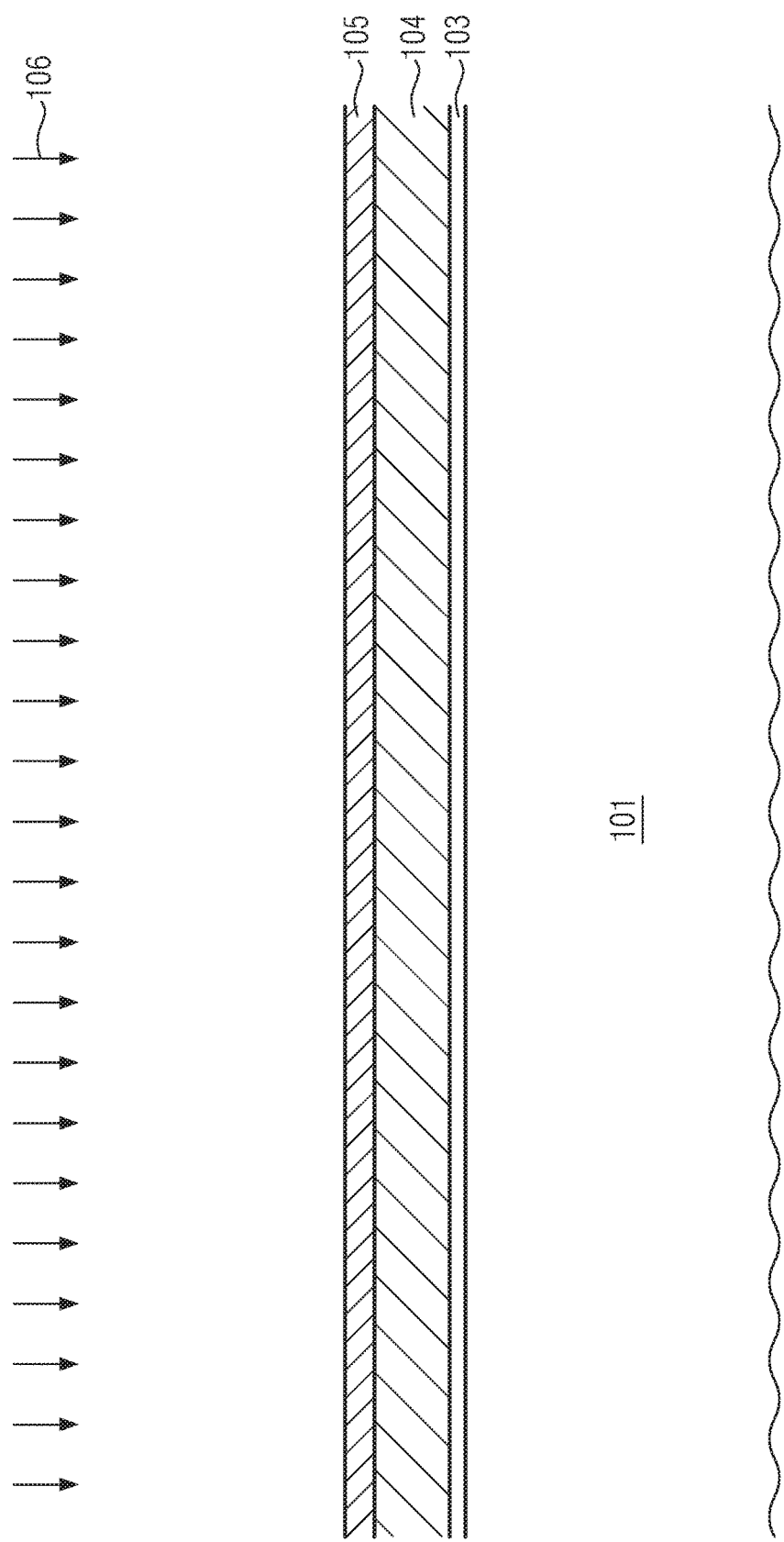
FIGS. 1-4 show schematic cross-sectional views illustrating a semiconductor-on-insulator wafer according to an embodiment and the manufacturing thereof.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In some embodiments, a voltage-controllable stressor may be provided for obtaining performance enhancements in both N-channel and P-channel field effect transistors employed in complementary metal oxide semiconductor (CMOS) technology. In some embodiments, ferroelectric silicon-doped hafnium dioxide may be used as a flexible stressor due to its piezoelectric properties. The reverse piezoelectric effect, being the internal generation of a mechanical strain in response to an applied electrical field, may be used to implement a stressor which can be turned on and off by means of a voltage applied thereto, individually for N-channel transistors and P-channel transistors. Piezoelectric and/or ferroelectric materials other than hafnium dioxide, such as zirconium dioxide, hafnium zirconium oxide, lead zirconate titanate (PZT) and/or lanthanum doped lead zirconate titanate (PLZT), may also be employed.

In some embodiments, an electrically insulating layer including a piezoelectric material may be provided below a semiconductor layer wherein source, channel and drain regions of a field effect transistor are formed and over which a gate structure of the field effect transistor is formed. A first electrode and a second electrode for applying a voltage to the piezoelectric material of the electrically insulating layer may be provided at laterally opposite sides of the electrically insulating layer. When a voltage is applied between the first electrode and the second electrode, the piezoelectric material can create a strain at least in the channel region of the transistor. The strain in the channel region can modify a charge carrier mobility in the channel region. Depending on the polarity of the voltage applied between the first electrode and the second electrode, a tensile or compressive strain may be obtained. A tensile strain can increase the mobility of electrons in the channel region, which may be beneficial for improving the performance of N-channel transistors. A compressive strain can increase the mobility of holes in the channel region, which may be beneficial for improving the performance of P-channel transistors.

In some embodiments, a semiconductor-on-insulator wafer including a support substrate, an electrically insulating layer over the support substrate and a semiconductor layer over the electrically insulating layer may be provided, wherein the electrically insulating layer includes a piezoelectric material. A trench isolation structure including a first trench and a second trench that extend through the semiconductor layer and are filled with an electrically insulating material may be formed. Over a portion of the semiconductor layer between the first trench and the second trench, a gate structure may be formed. Thereafter, a semiconductor-on-insulator etch back process may be performed for removing portions of the electrically insulating layer and the semiconductor layer at sides of the first and second trenches opposite the gate structure, wherein recesses are formed. In the recesses, electrodes that may be used for applying a voltage to the piezoelectric material of the electrically insulating layer may be formed. In some embodiments, this may be done by means of a selective epitaxial growth process wherein raised source and drain regions adjacent the gate structure may also be formed. Thereafter, an anneal process may be performed for activating and/or diffusing dopants, and a silicidation process may be performed for forming a silicide in the electrodes and the raised source and drain regions. Then, contacts for providing electrical connections to the electrodes, the source and drain regions and/or the gate structure may be formed, and back-end-of-line processes for completing the formation of the integrated circuit may be performed.

Further embodiments relate to methods that can be used for forming semiconductor-on-insulator wafers including an electrically insulating layer including a piezoelectric material. In such embodiments, an electrically insulating layer may be formed over a first semiconductor wafer, wherein the electrically insulating layer includes a layer of a material that is suitable for forming a piezoelectric layer, for example, hafnium dioxide, zirconium dioxide, hafnium zirconium oxide, lead zirconate titanate and/or lanthanum doped lead zirconate titanate. Then, ions may be implanted into a portion of the first wafer below the electrically insulating layer, wherein the implantation of ions defines a splitting position of the first wafer. Then, the first wafer may be bonded to a second semiconductor wafer, wherein the electrically insulating layer is arranged between the first wafer and second wafer. Thereafter, the first wafer may be split at the splitting position of the first wafer. A portion of the semiconductor material of the first wafer may remain bonded to the second wafer and can provide a semiconductor layer of the semiconductor-on-insulator wafer. A piezoelectric layer between the semiconductor layer and the first wafer may be formed on the basis of the layer of the material suitable for forming the piezoelectric layer, for example, by means of an annealing process.

In the following, semiconductor-on-insulator wafers according to various embodiments and methods for the manufacturing thereof will be described with reference to FIGS. 1-4.

FIG. 1 shows a schematic cross-sectional view of a first wafer 101 that may be used in various methods of manufacturing a semiconductor-on-insulator wafer according to various embodiments disclosed herein at an early stage of the manufacturing process. The wafer 101 may be a bulk semiconductor wafer, for example, a bulk silicon wafer. As will be detailed below, the wafer 101 may provide a semiconductor material from which a semiconductor layer of a semiconductor-on-insulator wafer will be formed. At the semiconductor layer, circuit elements such as field effect transistors may be formed. Source, channel and drain regions of the field effect transistors may be provided in the semiconductor layer.

A buffer layer 103 may be formed over the first wafer 101. The buffer layer 103 may include silicon dioxide, and it may be formed by means of oxidation processes such as thermal oxidation and/or deposition processes such as, for example, chemical vapor deposition or plasma enhanced chemical vapor deposition.

After the formation of the buffer layer 103, a layer 104 of a material that is suitable for forming a piezoelectric layer may be formed over the buffer layer 103. A piezoelectric material exhibiting a piezoelectric effect wherein an electric field is created in response to a mechanical strain, as well as a reverse piezoelectric effect wherein a mechanical strain is created in response to an electric field, may be provided on the basis of the material of the layer 104. In one illustrative embodiment, the layer 104 may be a ferroelectric material having a spontaneous electric polarization at temperatures below a Curie temperature thereof. Generally, ferroelectric materials may also be piezoelectric, since piezoelectricity is related to crystallographic symmetry properties that are present in ferroelectric materials.

As will be appreciated by those skilled in the art after a complete reading of the present application, the layer 104 of the material that is suitable for forming a piezoelectric layer need not have piezoelectric and/or ferroelectric properties directly after the formation thereof. In some embodiments, a treatment of the layer 104 of the material that is suitable for forming a piezoelectric layer, for example an annealing process, may be performed at a later stage of the manufacturing process, wherein a piezoelectric and/or ferroelectric layer 201 (see FIG. 2) is formed on the basis of the layer 104 of the material that is suitable for forming a piezoelectric layer.

In some illustrative embodiments, the layer 104 of the material that is suitable for forming the piezoelectric layer may include an oxide including hafnium and/or zirconium, for example, hafnium dioxide, zirconium dioxide and/or hafnium zirconium oxide.

In some illustrative embodiments, the material of the layer 104 may be doped. For example, in some embodiments, the layer 104 of the material suitable for forming the piezoelectric layer may include silicon-doped hafnium dioxide. Aluminum-doped hafnium dioxide, strontium-doped hafnium dioxide, yttrium-doped hafnium dioxide, gadolinium-doped hafnium dioxide and/or other rare earth doped hafnium oxide systems may also be employed. In further embodiments, the layer 104 may include substantially undoped hafnium dioxide. In some embodiments, the layer 104 may be formed by means of a deposition process that is adapted such that the as-deposited material of the layer 104 is substantially amorphous and substantially does not have ferroelectric properties.

In the illustrative embodiments wherein the layer 104 of the material suitable for forming the piezoelectric layer includes silicon-doped hafnium dioxide, an atomic layer deposition (ALD) process may be performed for depositing the layer 104. In the atomic layer deposition process, tetrakis-(ethylmethylamino)-hafnium, tetrakis-dimethylaminosilane and ozone may be employed. In some embodiments, metal organic precursors and/or halide precursors may additionally be used. In one illustrative embodiment, the atomic layer deposition may be performed at a temperature of less than 500° C., for example, at a temperature in a range from about 200-400° C., in particular at a temperature of about 350° C. A silicon content of the material of the layer 104 may be in a range from about 2-5 mol %, in particular in a range from about 2.5-4.5 mol %. The silicon content of the layer 104 may be controlled by varying the composition of gases employed in the atomic layer deposition process. Depositing the layer 104 of the material suitable for forming the piezoelectric layer at a relatively low temperature as described above may help to obtain a substantially amorphous structure of the as-deposited layer 104 of the material suitable for forming the piezoelectric layer.

In the illustrative embodiments wherein the layer 104 of the material suitable for forming the piezoelectric layer includes aluminum-doped hafnium dioxide, yttrium-doped hafnium dioxide or gadolinium-doped hafnium dioxide, an atomic layer deposition process wherein tetrakis-(ethylmethylamino)-hafnium, hafnium tetrachloride as well as ozone and/or water are used may be employed. Furthermore, depending on whether the material of the layer 104 includes aluminum, yttrium or gadolinium, trimethylaluminum, tetrakis(methylcyclopentadienyl)yttrium or tris (isopropylcyclopentane)gadolinium may be used. Further parameters of the atomic layer deposition process may correspond to those described above in the context of embodiments wherein the layer 104 of the material suitable for forming the piezoelectric layer includes silicon-doped hafnium dioxide.

In the illustrative embodiments wherein the layer 104 of the material suitable for forming the piezoelectric layer includes substantially undoped hafnium dioxide, a chemical vapor deposition process may be used for forming the layer 104 wherein materials and/or parameters corresponding to the embodiments described above are used, but the substances provided for doping the material of the layer 104 are omitted, may be employed.

In the illustrative embodiments wherein the layer 104 of the material suitable for forming the piezoelectric layer includes hafnium zirconium oxide, an atomic layer deposition process, wherein tetrakis(ethylmethylamino)zirconium, tetrakis(ethylmethylamino)hafnium and ozone are used, may be performed for depositing the material of the layer 104. In some embodiments, the hafnium zirconium oxide may have a composition in accordance with the formula $Hf_xZr_{1-x}O_2$ with $0<x<1$, for example, a composition in accordance with the formula $Hf_{0.5}Zr_{0.5}O_2$. Further parameters of the atomic layer deposition process may correspond to those described above in the context of embodiments wherein the layer 104 of the material suitable for forming the piezoelectric layer includes silicon-doped hafnium dioxide.

In the illustrative embodiments wherein the layer 104 of the material suitable for forming the piezoelectric layer includes zirconium dioxide, deposition processes similar to those described above in the context of embodiments wherein the material of the layer 104 includes hafnium dioxide may be used, wherein reactants including zirconium are employed instead of reactants including hafnium. In particular, tetrakis(ethylmethylamino)zirconium may be used instead of tetrakis(ethylmethylamino)hafnium and zirconium tetrachloride may be used instead of hafnium tetrachloride.

After the formation of the layer 104 of the material suitable for forming the piezoelectric layer, a capping layer 105 may be formed on the layer 104. In some embodiments, the capping layer 105 may include titanium nitride, and it may be formed by means of deposition techniques such as chemical vapor deposition, plasma enhanced chemical vapor deposition and/or physical vapor deposition.

After the formation of the capping layer 105, an annealing process may be performed, as schematically denoted by reference numeral 106. The annealing process 106 may be a rapid thermal annealing process wherein the first wafer 101 is exposed to a temperature that is sufficient for obtaining a crystallization of the material suitable for forming the piezoelectric layer of the layer 104, for example, a temperature in a range from about 300-500° C. Due to the crystallization of the layer 104 of material suitable for forming the piezoelectric layer in the presence of the capping layer 105 thereon, a crystal structure having piezoelectric and/or ferroelectric properties may be obtained.

Figure 2:
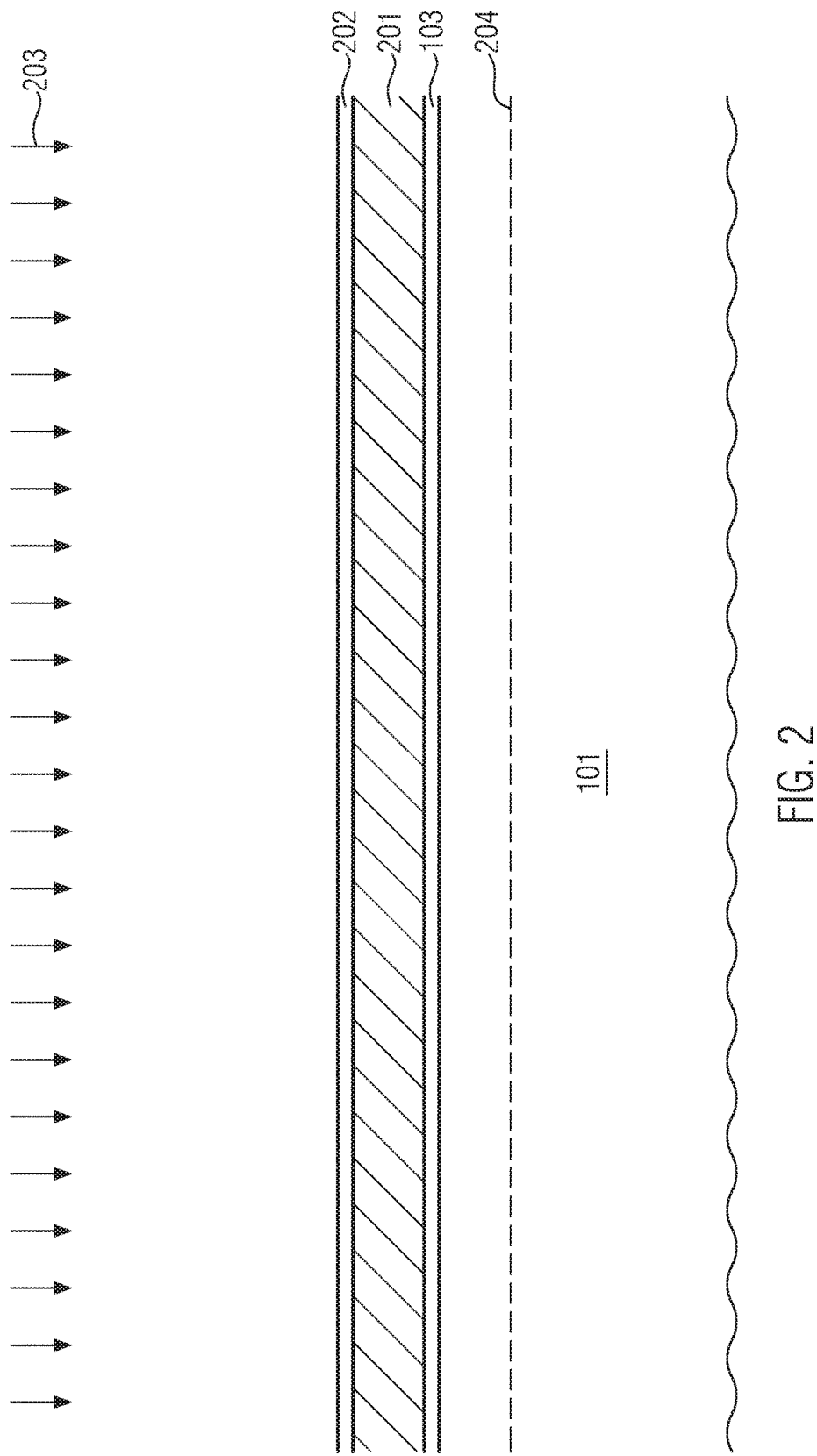

FIG. 2 shows a schematic cross-sectional view of the first wafer 101 at a later stage of manufacturing a semiconductor-on-insulator wafer in accordance with one illustrative embodiment disclosed herein. The crystallization of the layer 104 of material suitable for forming a piezoelectric layer may result in the formation of a piezoelectric layer 201 which, in some embodiments, may be a ferroelectric layer.

After the annealing process 106, the capping layer 105 may be removed by means of an etch process adapted for selectively removing the material of the capping layer 105 relative to the material of the piezoelectric layer 201. In embodiments wherein the capping layer 105 includes titanium nitride, the etch process employed for removing the capping layer 105 may be a known wet or dry etch process for etching of titanium nitride.

After the removal of the capping layer 105, a buffer layer 202 may be formed over the piezoelectric layer 201. Similar to the buffer layer 103, the buffer layer 202 may include silicon dioxide. The buffer layer 202 may be formed by means of a deposition process such as chemical vapor deposition or plasma enhanced chemical vapor deposition.

As will be appreciated by those skilled in the art after a complete reading of the present application, the present disclosure is not limited to embodiments wherein the layer 104 of the material suitable for forming the piezoelectric layer and the piezoelectric layer 201 include one of hafnium dioxide, zirconium dioxide and/or hafnium zirconium oxide, as described above. In other embodiments, different materials may be used for forming the layer 104 of the material suitable for forming the piezoelectric layer and the piezoelectric layer 201, respectively. For example, in some embodiments, lead zirconate titanate (PZT), being a chemical compound including lead, zirconium, titanium and oxygen and having a composition in accordance with the chemical formula $Pb(Zr_xTi_{1-x})O_3$, may be used, wherein x may be in a range from about 0 to about 1, in particular in a range from about 0.4 to about 0.6, for example about 0.52. Lanthanum doped lead zirconate titanate (PLZT) compounds such as, for example, $Pb_{0.83}La_{0.17}(Zr_{0.3}Ti_{0.7})_{0.9575}O_3$ (PLZT 17/30/70), may also be used. Methods for forming the layer 104 may include pulsed laser deposition and/or sputtering, and an annealing process may be performed after the formation of the layer 104 for obtaining a crystallization of the material of the layer 104, wherein the piezoelectric layer 201 is obtained. A formation of a capping layer, such as the capping layer 105 described above with reference to FIG. 1, may be omitted in embodiments wherein PZT or PLZT is used since a crystal structure of these materials providing piezoelectric and ferroelectric properties may also be obtained when they are crystallized in the absence of a capping layer formed thereon. Similar to the embodiments described above, buffer layers 103, 202 above and below the layer 201 of piezoelectric material may be employed in embodiments wherein the layer 201 of piezoelectric material includes PZT and/or PLZT.

After the formation of the buffer layer 202, an ion implantation process 203 may be performed. In the ion implantation process 203, the first wafer 101 may be irradiated with hydrogen ions or ions of a noble gas such as, for example, helium. An ion energy of the ion implantation process 203 may be adapted such that a majority of the implanted ions comes to rest in the semiconductor material of the first wafer 101 at an ion implantation depth below the interface between the semiconductor material of the first wafer 101 and the buffer layer 103 that corresponds to a desired thickness of the semiconductor layer of the semiconductor-on-insulator wafer to be formed. For example, the ion implantation depth may be slightly greater than the desired thickness of the semiconductor layer. The implantation of ions in the ion implantation process 203 may define a splitting position 204 of the first wafer. The splitting position 204 may be at an ion implantation depth below the interface between the semiconductor material of the first wafer 101 and the buffer layer 103 that is approximately equal to the depth at which the majority of the implanted ions comes to rest in the semiconductor material of the first wafer 101. As will be detailed below, in later stages of manufacturing a semiconductor-on-insulator wafer in accordance with one illustrative embodiment disclosed herein, the first wafer 101 may be split at the splitting position 204. (See FIG. 3).

Figure 3:
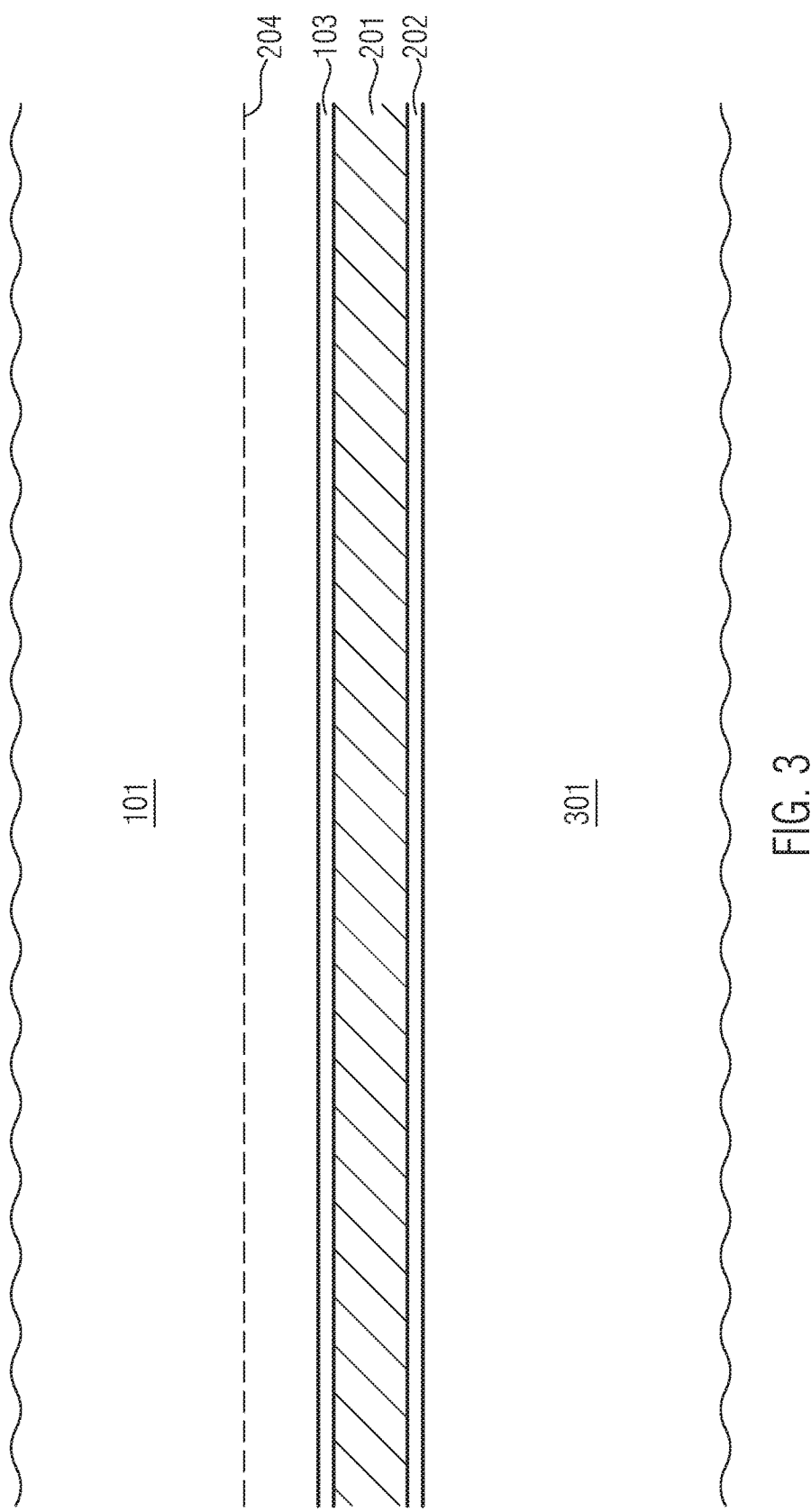

FIG. 3 shows a schematic cross-sectional view illustrating a later stage of manufacturing a semiconductor-on-insulator wafer in accordance with one illustrative embodiment disclosed herein, at which the first wafer 101 is bonded to a second wafer 301. The second wafer 301 may be a bulk semiconductor wafer including a semiconductor material such as, for example, silicon. The first wafer 101 may be bonded to the second wafer 301 after the ion implantation process 203 using bonding techniques corresponding to those conventionally employed in the formation of semiconductor-on-insulator wafers having electrically insulating layers formed of silicon dioxide. The first wafer 101 may be bonded to the second wafer 301 such that the piezoelectric layer 201 and the buffer layers 103, 202 are arranged substantially over an entire main surface of the second wafer 301 between the semiconductor materials of the wafers 101, 301 and form an electrically insulating layer providing electrical insulation between the semiconductor materials of the wafers 101, 301.

Figure 4:
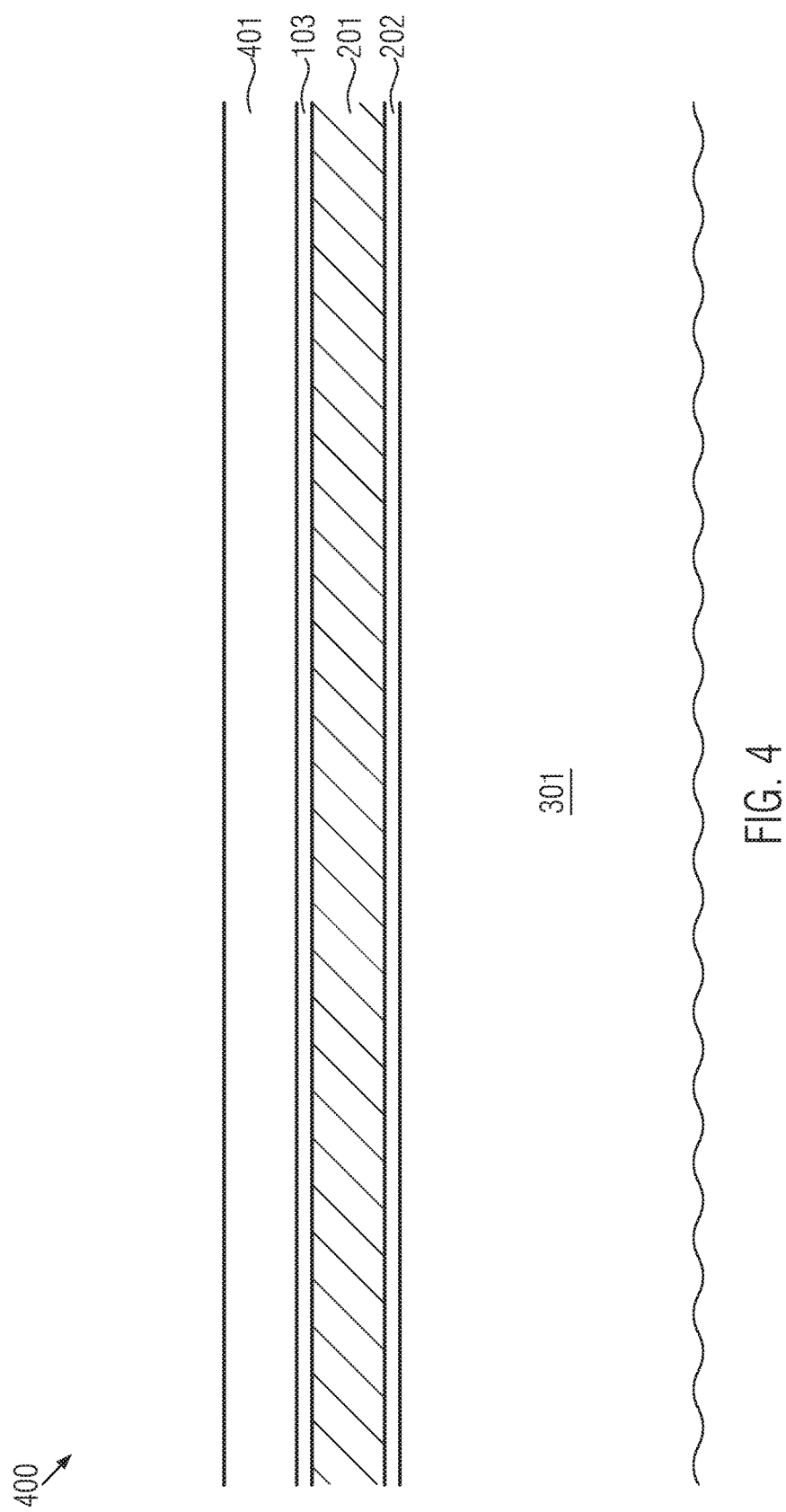

FIG. 4 shows a schematic cross-sectional view illustrating a later stage of manufacturing a semiconductor-on-insulator wafer in accordance with one illustrative embodiment disclosed herein. After bonding the first wafer 101 to the second wafer 301, the first wafer 101 may be split at the splitting position 204 (see FIG. 3) defined by the ion implantation process 203. In some embodiments, an annealing process may be performed for splitting the first wafer 101. In the annealing process, bubbles of the substance implanted into the first wafer 101 in the ion implantation process 203 may be formed, for example, hydrogen bubbles in embodiments wherein hydrogen ions are implanted into the first wafer 101 in the ion implantation process 203, or bubbles of a noble gas in embodiments wherein ions of a noble gas are implanted into the first wafer 101 in the ion implantation process 203. In addition to the formation of the bubbles, other processes, for example, a crystalline rearrangement, may occur in the first wafer.

The formation of the bubbles and/or other processes occurring in the first wafer 101 in the annealing process may lead to a splitting of the first wafer 101 at the splitting position 204. Due to the splitting of the first wafer 101, portions of the first wafer 101 above the splitting position 204 which are more distant from the second wafer 301 than portions of the first wafer 101 below the splitting position 204 may be removed from the second wafer 301. The portions of the first wafer 101 below the splitting position 204 may remain bonded to the second wafer 301 and may provide a semiconductor layer 401 that is arranged above the electrically insulating layer provided by the piezoelectric layer 201 and the buffer layers 103, 202, at a side of the electrically insulating layer opposite the second wafer 301.

In some embodiments, after the splitting of the first wafer 101, a polishing process, for example, a chemical mechanical polishing process, may be performed for reducing a roughness of a surface of the semiconductor layer 401 and/or for reducing a thickness of the semiconductor layer 401.

The second wafer 301, the semiconductor layer 401 and the electrically insulating layer including the piezoelectric layer 201 and the buffer layers 103, 202 form a piezoelectric and/or ferroelectric semiconductor-on-insulator wafer 400, wherein the second wafer 301 provides a support substrate that is electrically insulated from the semiconductor layer 401 by the electrically insulating layer including the piezoelectric material of the piezoelectric layer 201.

The present disclosure is not limited to embodiments wherein the buffer layers 103, 202 are employed. In other embodiments, one or both of the buffer layers 103, 202 may be omitted, and the layer 201 of the piezoelectric material may contact the semiconductor layer 401 formed from the semiconductor material of the first wafer 101 and/or the second wafer 301 providing the support substrate of the semiconductor-on-insulator wafer 400.

In some embodiments, semiconductor-on-insulator wafers including an electrically insulating layer including a piezoelectric and/or ferroelectric material as described above may be used for forming semiconductor structures such as, for example, integrated circuits that include transistors wherein the reverse piezoelectric effect is employed for creating a strain in the channel regions of the transistors. In the following, such semiconductor structures and methods for the formation thereof will be described with reference to FIGS. 5-8.

Figure 5:
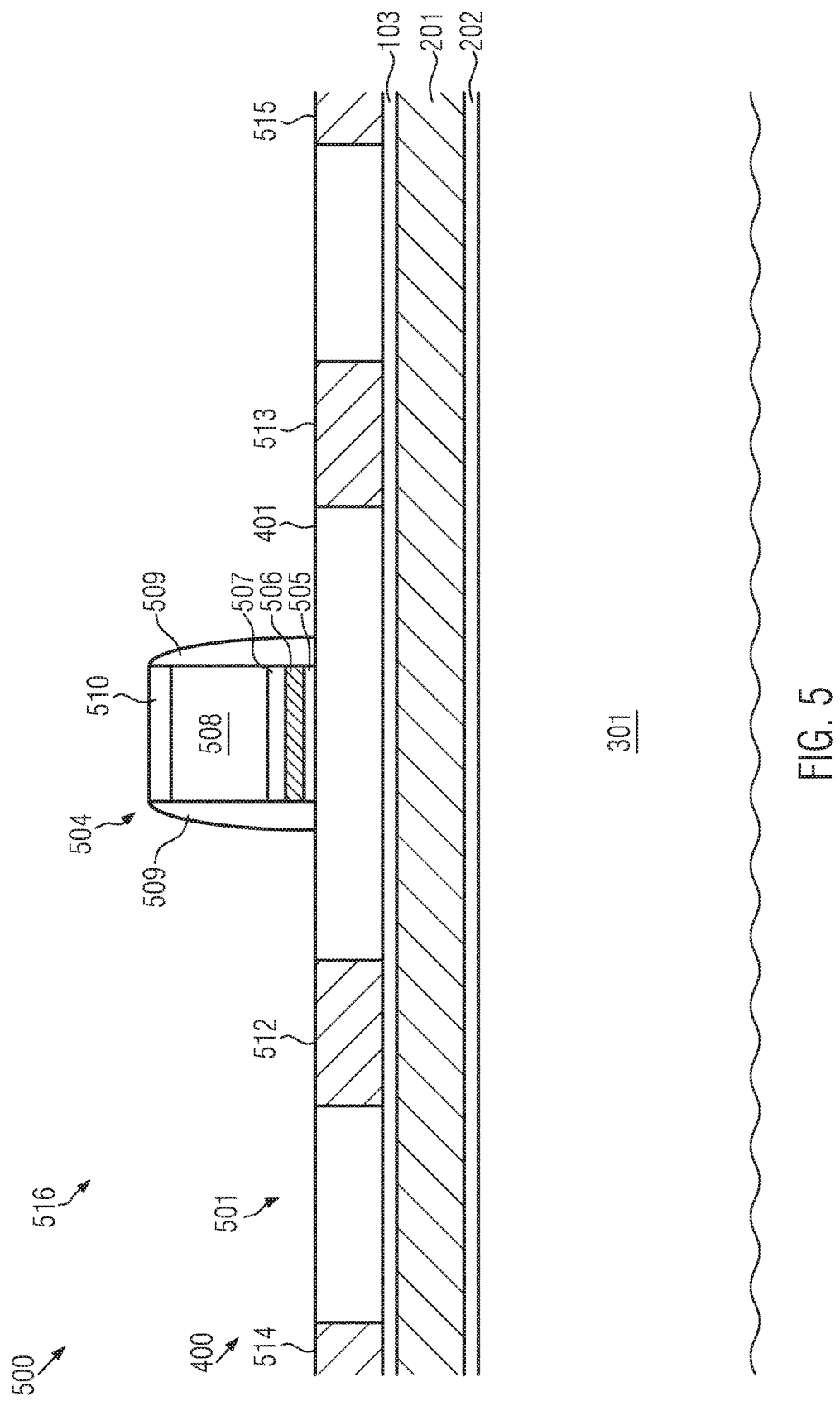
FIGS. 5-8 show schematic cross-sectional views of a semiconductor structure according to an embodiment in stages of a method of manufacturing a semiconductor structure according to an embodiment.

FIG. 5 shows a schematic cross-sectional view of a portion of a semiconductor structure 500 at a stage of manufacturing a semiconductor structure in accordance with one illustrative embodiment disclosed herein. The semiconductor structure 500 includes a semiconductor-on-insulator wafer 400 as described above with reference to FIG. 1-4. The portion of the semiconductor structure 500 shown in FIG. 5 includes a transistor element 516 from which a transistor 811 (see FIG. 8) will be formed.

The transistor element 516 may include a gate structure 504 that is provided above a portion of the semiconductor layer 401 of the semiconductor-on-insulator wafer 400 in the transistor element 516. The gate structure 504 is provided at a side of the semiconductor layer 401 that is opposite the electrically insulating layer including the piezoelectric layer 201 and, optionally, the buffer layers 103, 202, so that the electrically insulating layer can provide an electrical insulation between the portion of the semiconductor layer 401 in the transistor element 516 and the support substrate provided by the second wafer 301. The gate structure 504 may include a gate insulation layer, which may include sublayers 505, 506 that are formed of different materials. For example, in some embodiments, the sublayer 505 may include silicon dioxide and the sublayer 506 may include a high-k material having a greater dielectric constant than silicon dioxide, for example, hafnium dioxide, zirconium dioxide, hafnium silicon oxynitride and/or zirconium silicon oxynitride. In embodiments wherein the high-k material of the sublayer 506 includes hafnium dioxide or zirconium dioxide, the hafnium dioxide or zirconium dioxide, respectively, may have a crystal structure that substantially does not have ferroelectric properties.

The gate structure 504 may additionally include a gate electrode, which may include a workfunction adjustment metal layer 507 and a polysilicon layer 508. The metal of the workfunction adjustment metal layer 507 may be selected in accordance with a type of the transistor 811 that is formed on the basis of the transistor element 516. For example, if an N-channel transistor is to be formed, the workfunction adjustment metal layer 507 may include an N-channel workfunction adjustment metal such as, for example, lanthanum, lanthanum nitride and/or titanium nitride. In embodiments wherein a P-channel transistor is to be formed, the workfunction adjustment metal layer 507 may include aluminum, aluminum nitride and/or titanium nitride. The polysilicon layer 508 may include doped polysilicon.

The gate structure 504 may additionally include a sidewall spacer 509 provided adjacent the gate insulation layer and the gate electrode, and a cap layer 510 over the polysilicon layer 508. The sidewall spacer 509 and the cap layer 510 may be formed of one or more electrically insulating materials such as, for example, silicon dioxide, silicon oxynitride and/or silicon nitride.

The semiconductor structure 500 may further include a trench isolation structure 501. The trench isolation structure 501 may include a plurality of trenches 512, 513, 514, 515 extending through the semiconductor layer 401 and being filled with an electrically insulating material such as, for example, silicon dioxide.

The trench isolation structure 501 may include a pair of trenches 512, 513 that are provided on laterally opposite sides of the portion of the semiconductor layer 401 in the transistor element 516 wherein a source region 801, a channel region 802 and a drain region 803 will be formed in later stages of the manufacturing process (see FIG. 8). Between the gate structure 504 and the trench 512, there may be a portion of the semiconductor layer 401 that is not covered by the gate structure 504. Similarly, between the gate structure 504 and the trench 513, which is provided on a side of the gate structure 504 opposite the trench 512, there may be a portion of the semiconductor layer 401 that is not covered by the gate structure 504. As will be detailed below, the trenches 512, 513 filled with electrically insulating material may provide an electrical insulation between the portion of the semiconductor layer 401 in the transistor 811 to be formed from the transistor element 516 and electrodes that will be formed in later stages of the manufacturing process and may be used for applying a voltage to a portion of the piezoelectric layer 201 in the transistor 811.

The trenches 514, 515 filled with electrically insulating material may provide electrical insulation between the transistor 811 formed from the transistor element and other circuit elements (not shown) that are formed in the semiconductor structure 500.

For forming the semiconductor structure 500 as shown in FIG. 5, the semiconductor-on-insulator wafer 400 may be provided. This may be done as described above with reference to FIGS. 1-4. The formation of the semiconductor-on-insulator wafer 400 need not be performed in the same factory as the formation of the semiconductor structure 500. For example, the semiconductor-on-insulator wafer 400 may be provided by a wafer manufacturer.

The trench isolation structure 501 may be formed by means of known techniques for the formation of shallow trench isolation structures, which may include a formation of the trenches 512, 513, 514, 515 using techniques of photolithography and etching and techniques of oxidation, deposition and/or chemical mechanical polishing for filling the trenches 512, 513, 514, 515 with an electrically insulating material such as silicon dioxide.

After the formation of the trench isolation structure 501, a gate stack including layers of the materials of the sublayers 505, 506 of the gate insulation layer, the workfunction adjustment metal layer 507, the polysilicon layer 508 and the cap layer 510 may be formed using deposition techniques such as chemical vapor deposition, plasma-enhanced chemical vapor deposition, physical vapor deposition and/or atomic layer deposition. Thereafter, the gate stack may be patterned using techniques of photolithography and etching for forming the gate insulation layer and the gate electrode of the gate structure 504. Then, the sidewall spacer 509 may be formed by substantially isotropically depositing one or more layers of one or more sidewall spacer materials and anisotropically etching the one or more layers of one or more sidewall spacer materials.

Further features of the formation of the gate structure 504 may correspond to features of techniques conventionally employed in the formation of gate structures of field effect transistors.

Figure 6:
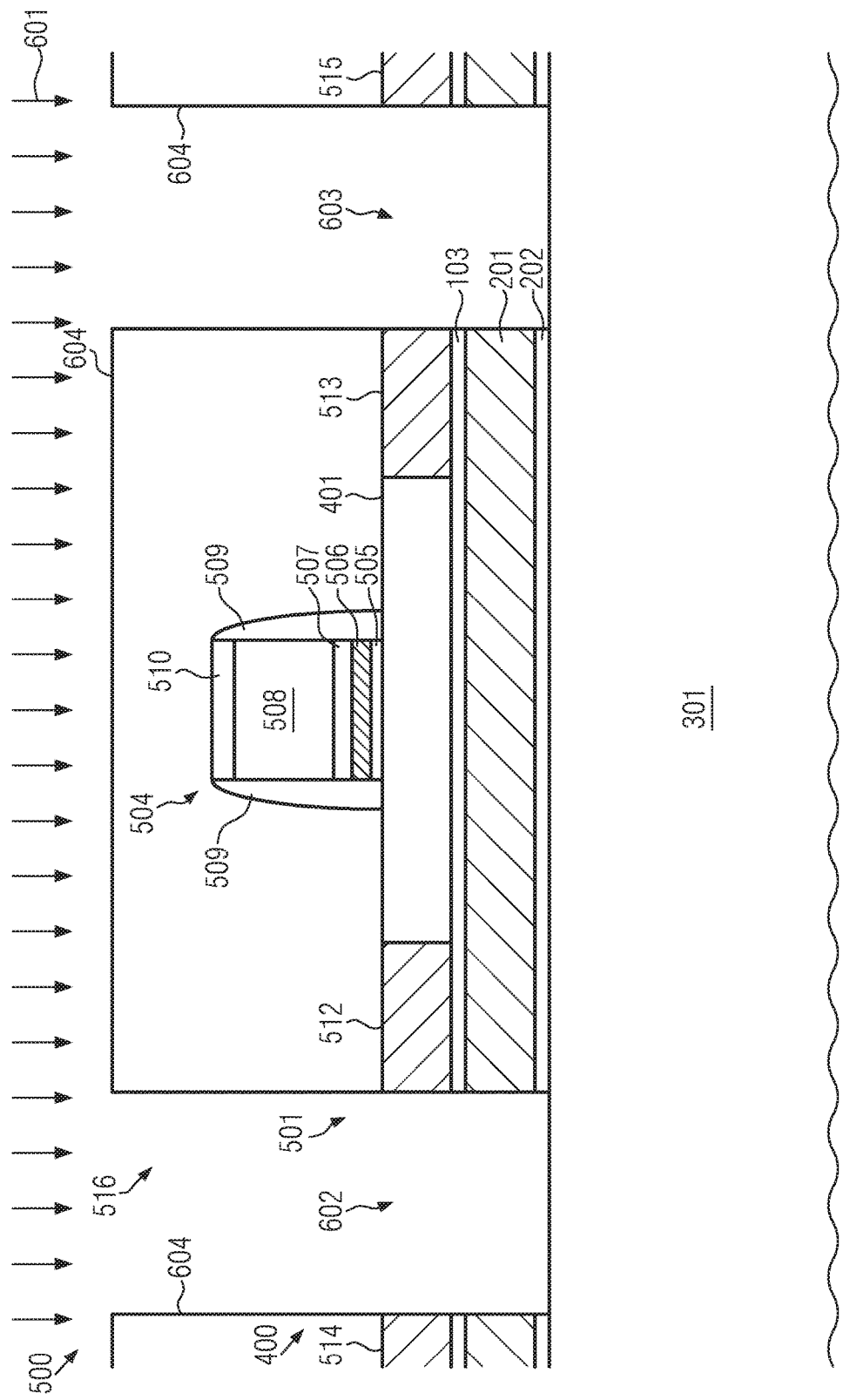

FIG. 6 shows a schematic cross-sectional view of the semiconductor structure 500 at a later stage of manufacturing the semiconductor structure in accordance with one illustrative embodiment disclosed herein. After the formation of the trench isolation structure 501 and the gate structure 504, a mask 604 may be formed over the semiconductor structure 500. The mask 604 may be a photoresist mask, and it may be formed by means of techniques of photolithography. The mask 604 may cover portions of the semiconductor structure 500 other than portions of the semiconductor layer 401 and the electrically insulating layer between the trenches 512, 514 and between the trenches 513, 515.

After the formation of the mask 604, one or more etch processes 601 may be performed. The one or more etch processes 601 may be adapted for removing materials of the semiconductor layer 401, the buffer layers 103, 202 and the piezoelectric layer 201. The one or more etch processes 601 may include wet or dry etch processes for removing the materials of the semiconductor layer 401, the buffer layers 103, 202 and the piezoelectric layer 201.

The one or more etch processes 601 may form a recess 602 at a side of the trench 512 opposite the gate structure 504 and a recess 603 at a side of the trench 513 opposite the gate structure 504. In some embodiments, at the bottom of the recesses 602, 603, the semiconductor material of the second wafer 301 may be exposed.

Figure 7:
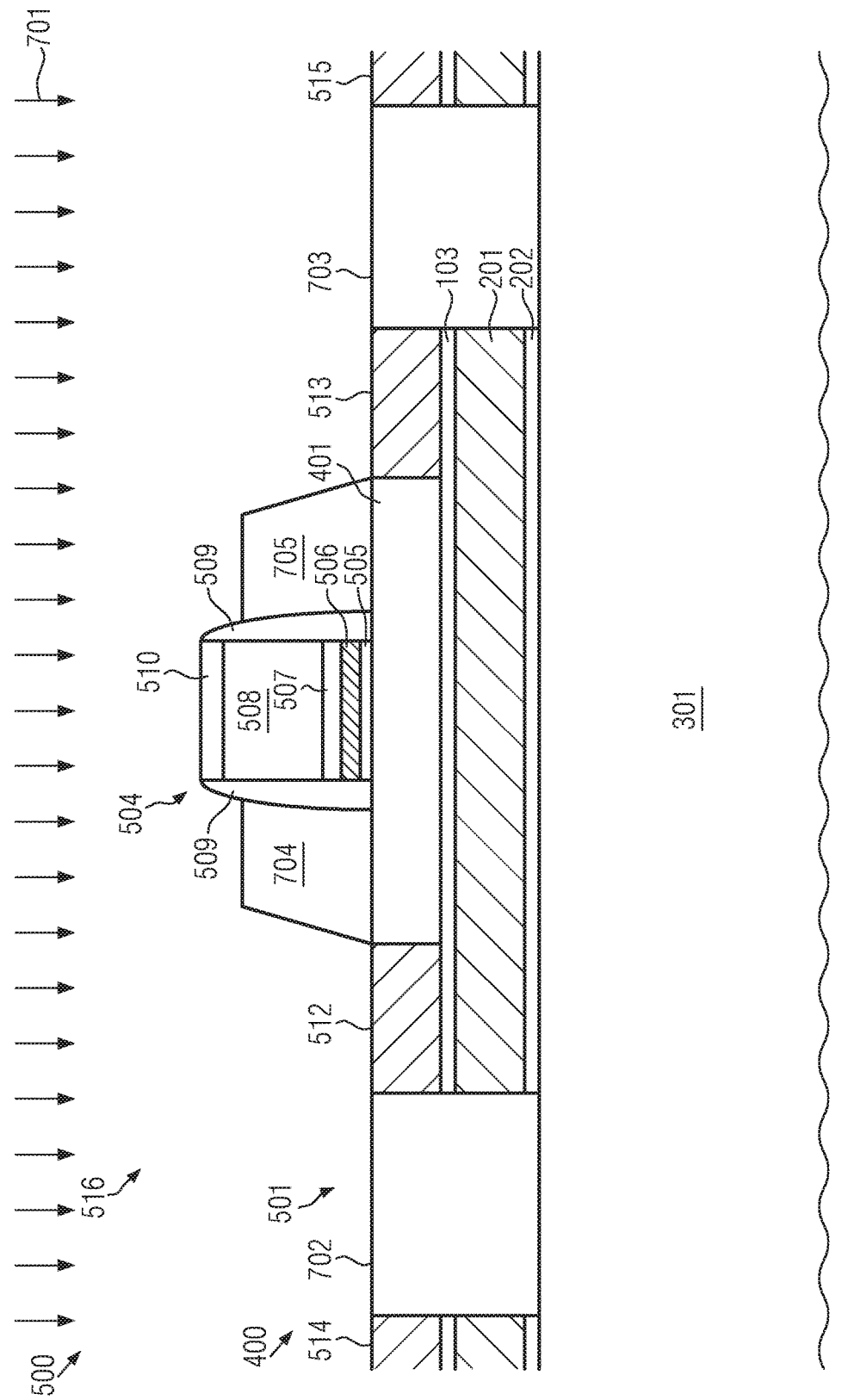

FIG. 7 shows a schematic cross-sectional view of the semiconductor structure 500 at a later stage of manufacturing in accordance with one illustrative embodiment disclosed herein. After the one or more etch processes 601, the mask 604 may be removed by means of a photoresist strip process, and an epitaxial growth process 701 may be performed. The epitaxial growth process 701 may be a selective epitaxial growth process adapted for selectively depositing a semiconductor material such as silicon at portions of the semiconductor structure 500 wherein a semiconductor material such as silicon is exposed at the surface of the semiconductor structure 500, whereas substantially no semiconductor material or only a small amount of semiconductor material is deposited at portions of the semiconductor structure 500 including other materials such as, for example, the trenches 512, 513, 514, 515 filled with electrically insulating material, the sidewall spacer 509 and the cap layer 510.

In some embodiments, the semiconductor material deposited by the epitaxial growth process 701 may be doped in situ during the epitaxial growth process 701. The type of doping may correspond to the type of the transistor 811 to be formed. In embodiments wherein an N-channel transistor is to be formed, the epitaxial growth process 701 may be adapted for depositing N-doped semiconductor material. In embodiments wherein a P-channel transistor is to be formed, the epitaxial growth process 701 may be adapted for depositing P-doped semiconductor material.

In the epitaxial growth process 701, a raised source region 704 and a raised drain region 705 may be formed over portions of the semiconductor layer 401 adjacent the gate structure 504. Additionally, in the epitaxial growth process 701, an electrode 702 may be formed in the recess 602, and an electrode 703 may be formed in the recess 603. The electrode 702 is provided at a side of the trench 512 opposite the gate structure 504 so that the trench 512 filled with the electrically insulating material may provide an electrical insulation between the electrode 702 and the semiconductor layer 401. Similarly, the electrode 703 may be arranged at a side of the trench 513 opposite the gate structure 504 so that the trench 513 filled with the electrically insulating material may provide an electrical insulation between the electrode 703 and the semiconductor layer 401.

In some embodiments, a type of doping of portions of the second wafer 301 below the electrodes 702, 703 that is opposite to the type of doping of the electrodes 702, 703 may be provided. Thus, PN transitions between the electrodes 702, 703 and portions of the second wafer 301 therebelow may be provided. The PN transitions may help to provide an electrical insulation between the electrodes 702, 703. In some embodiments, the doping of portions of the second wafer 301 below the electrodes 702, 703 may correspond to a base doping of the second wafer 301. In other embodiments, an ion implantation wherein the semiconductor structure 500 is irradiated with ions of a dopant may be performed after the one or more etch processes 601 that are employed for forming the recesses 602, 603 and before the removal of the mask 604. In the ion implantation, ions of a dopant of a type opposite to the doping of the semiconductor material deposited in the epitaxial growth process 701 may be implanted into the portions of the second wafer 301 below the recesses 602, 603. In further embodiments, a doped well region may be formed in the semiconductor material of the second wafer, for example, before the formation of the trench isolation structure 501 and/or the formation of the gate structure 504.

Figure 8:
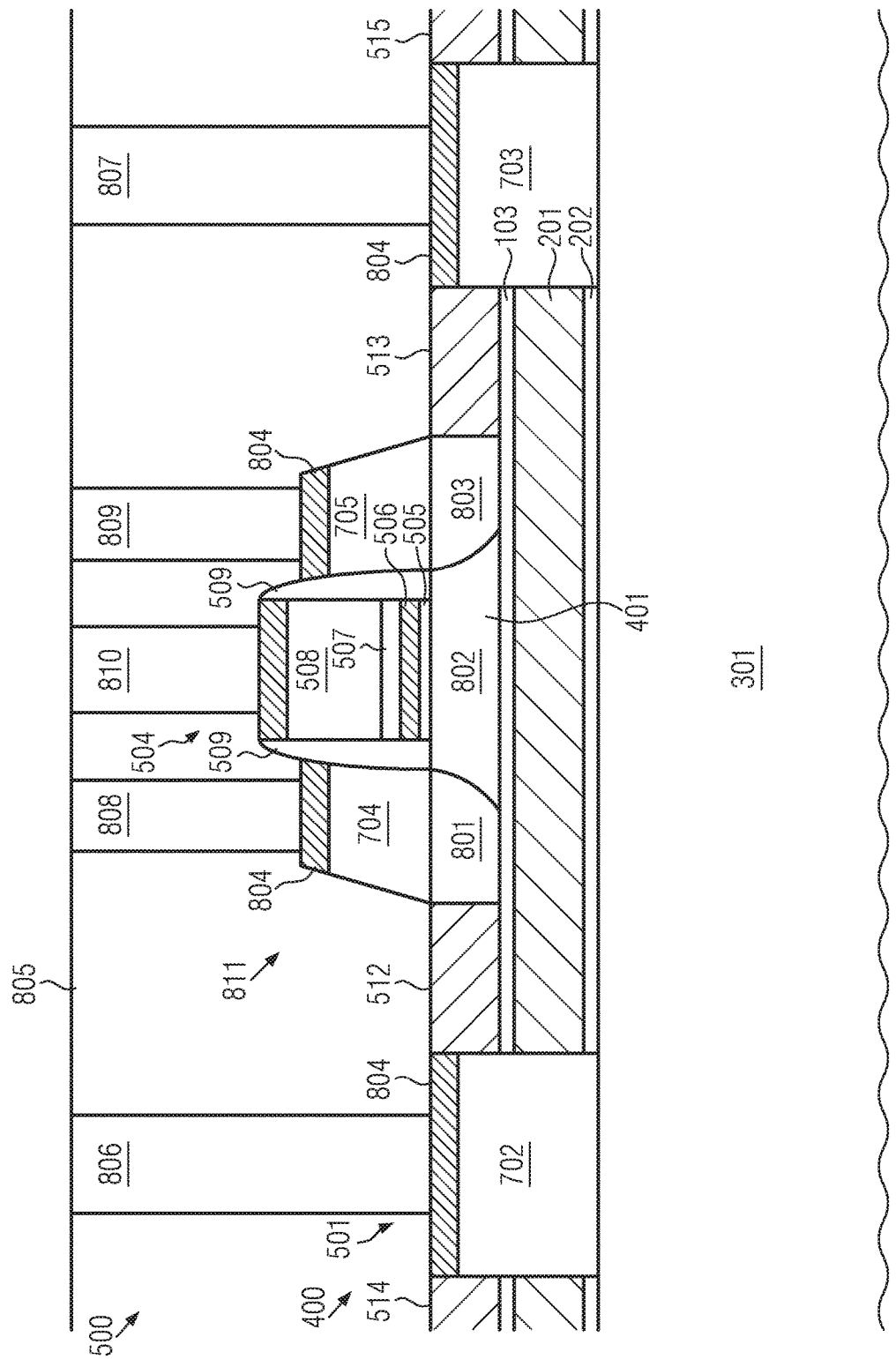

FIG. 8 shows a schematic cross-sectional view of the semiconductor structure 500 at a later stage of manufacturing the semiconductor structure in accordance with one illustrative embodiment disclosed herein. After the epitaxial growth process 701, an anneal process may be performed. The anneal process may activate dopants in the semiconductor structure 500. Additionally, a diffusion of dopants from the raised source region 704 and the raised drain region 705 into portions of the semiconductor layer 401 therebelow may be obtained. Thus, a source region 801 below the raised source region 704 and a drain region 803 below the raised drain region 705 may be formed. A portion of the semiconductor layer 401 below the gate structure 504 may provide a channel region 802 between the source region 801 and the drain region 803 that is doped differently than the source region 801 and the drain region 803. A doping of the channel region 802 may correspond to an original doping of the semiconductor layer 401. In some embodiments, the channel region 802 may be substantially undoped. In other embodiments, the channel region 802 may have a doping opposite to the type of doping of the source region 801 and the drain region 803. In embodiments wherein an N-channel transistor is formed, the channel region 802 may be P-doped, and in embodiments wherein a P-channel transistor is formed, the channel region 802 may be N-doped. The formation of the source region 801, the channel region 802 and the drain region 803 forms the transistor 811 on the basis of the transistor element 516.

Thereafter, a silicidation process may be performed wherein a silicide 804 is formed in each of the electrodes 702, 703, the raised source region 704, the raised drain region 705 and the polysilicon layer 508 of the gate structure 504. For this purpose, an etch process adapted for removing the material of the cap layer 510 of the gate structure 504 may be performed so that the polysilicon layer 508 is exposed at a top surface of the gate structure 504. Thereafter, a layer of a metal, for example, a nickel layer, may be deposited over the semiconductor structure 500 by means of a deposition process such as, for example, physical vapor deposition. Then, one or more annealing processes may be performed for reacting the metal with the semiconductor material of the electrodes 702, 703, the raised source region 704, the raised drain region 705 and the polysilicon layer 508. Unreacted residues of the metal layer may be removed by means of an etch process.

Thereafter, an interlayer dielectric 805 may be formed over the semiconductor structure 500. The interlayer dielectric 805 may include one or more electrically insulating materials such as, for example, silicon nitride and/or silicon dioxide. For forming the interlayer dielectric, one or more layers of one or more materials of the interlayer dielectric 805 may be deposited over the semiconductor structure 500. Then, a chemical mechanical polishing process may be performed for obtaining a substantially planar surface of the interlayer dielectric 805.

Then, electrode contacts 806, 807, a source contact 808, a drain contact 809 and a gate contact 810 may be formed. Each of the electrode contacts 806, 807, the source contact 808, the drain contact 809 and the gate contact 810 may include a contact hole extending through the interlayer dielectric 805 and filled with an electrically conductive material such as, for example, tungsten. The electrode contact 806 may be connected to the electrode 702, and the electrode contact 807 may be connected to the electrode 703. By applying a voltage between the electrode contacts 806, 807, an electric voltage may be applied to the portion of the piezoelectric layer 201 in the transistor 811 below the source region 801, the channel region 802 and the drain region 803.

The source contact 808 may be connected to the raised source region 704, the drain contact 809 may be connected to the raised drain region 705 and the gate contact 810 may be connected to the gate electrode provided by the polysilicon layer 508 and the workfunction adjustment metal layer 507 of the gate structure 504. Thus, a voltage may be applied between the source region 801 and the drain region 803, and a drain current flowing between the source region 801 and the drain region 803 may be controlled by applying a voltage to the gate electrode of the transistor 811.

After the formation of the electrode contacts 806, 807, the source contact 808, the drain contact 809 and the gate contact 810, back-end-of-line processes may be performed for forming further interlayer dielectrics, contact vias and electrically conductive lines in interconnect levels of the semiconductor structure 500. Thus, one or more integrated circuits may be formed on the basis of the semiconductor structure 500.

In some embodiments, a poling of the material of the piezoelectric layer 201 below the source region 801, the channel region 802 and the drain region 803 may be performed. For this purpose, in accordance with one illustrative embodiment, an electric voltage having an absolute value in a range from about 3 V to about 6 V may be applied between the electrodes 702, 703. Thus, an alignment of electrical dipoles and/or a ferroelectric polarization of the piezoelectric material below the source region 801, the channel region 802 and the drain region 803 may be obtained.

In the operation of the transistor 811, an electric voltage may be applied between the electrodes 702, 703. The piezoelectric material of the portion of the piezoelectric layer 201 below the source region 801, the channel region 802 and the drain region 803 of the transistor 811 can create a strain in the channel region 802 in response to the voltage applied between the electrode 702, 703 due to the reverse piezoelectric effect. The strain can have an influence on a mobility of charge carriers in the channel region 802, as will be explained in the following with reference to FIGS. 9a and 9b.

Figure 9B:
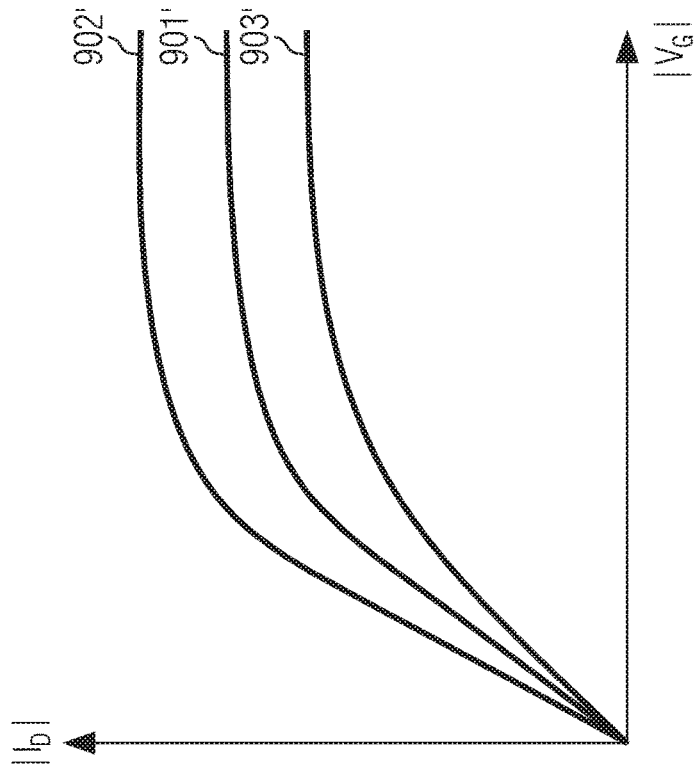
FIGS. 9a and 9b show graphs illustrating drain currents in transistors according to embodiments.
Figure 9A:
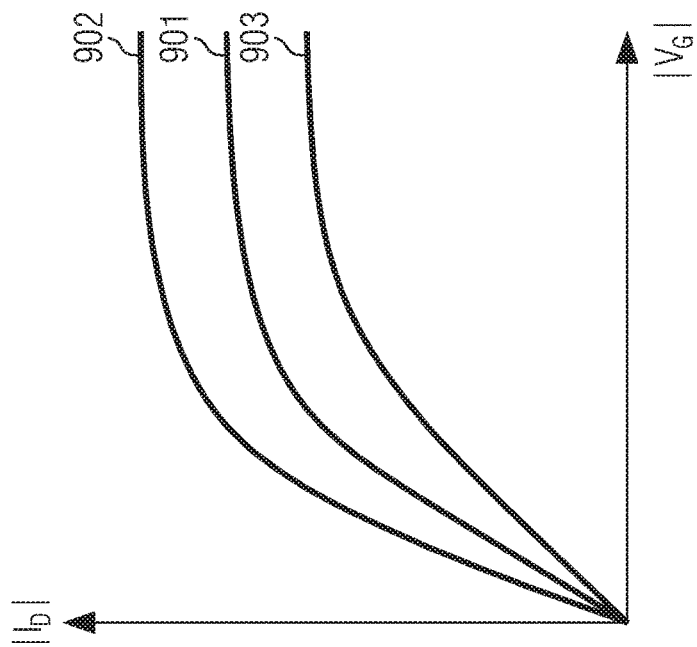

FIGS. 9a and 9b show schematic diagrams illustrating a dependency of an absolute value of a drain current $I_D$ on an absolute value of a gate voltage $V_G$, wherein FIG. 9a illustrates the drain current obtained in embodiments wherein the transistor 811 is an N-channel transistor, and FIG. 9b illustrates the drain current obtained in embodiments wherein the transistor 811 is a P-channel transistor.

In FIG. 9a, curve 901 illustrates the dependency of the drain current on the gate voltage in the absence of a voltage applied between the electrodes 702, 703. Curve 902 illustrates the dependency of the drain current on the gate voltage in the case of a positive voltage applied between the electrodes 702, 703, and curve 903 illustrates the dependency of the drain current on the gate voltage in the case of a negative voltage applied between the electrodes 702, 703. Herein, a voltage between the electrodes 702, 703 will be denoted as a positive voltage if the piezoelectric material of the piezoelectric layer 201 creates a tensile stress in response thereto, and a voltage between the electrodes 702, 703 will be denoted as a negative voltage if the piezoelectric material of the piezoelectric layer 201 creates a compressive strain in response thereto. If a greater electric potential is to be applied to the electrode 702 or to the electrode 703 for obtaining a positive voltage can depend on the orientation of electric dipoles and/or the ferroelectric polarization of the piezoelectric material of the piezoelectric layer 201, which may be controlled by poling the piezoelectric layer, as described above. As can be seen from FIG. 9a, a positive voltage between the electrodes 702, 703 can increase the drain current obtained due to the improvement of the mobility of electrons obtained by a tensile strain in the channel region 802, as illustrated by curve 902. To the contrary, a negative voltage between the electrodes 702, 703 can reduce the drain current due to a reduction of the mobility of electrons in the channel region 802 that may be caused by a compressive strain, as illustrated by curve 903.

In FIG. 9b, curve 901' illustrates the dependency of the drain current on the gate voltage in the absence of a voltage between the electrodes 702, 703 that can be obtained in embodiments wherein the transistor 811 is a P-channel transistor. Curves 902' and 903' illustrate the dependency of the drain current on the gate voltage in the P-channel transistor in the case of a positive and a negative voltage, respectively, applied between the electrodes 702, 703. A negative voltage between the electrodes 702, 703 can improve the mobility of holes in the channel region 802 due to the creation of a compressive strain so that a greater drain current can be obtained, as illustrated by curve 903'. To the contrary, a positive voltage between the electrodes 702, 703 can reduce the mobility of holes in the channel region of the P-channel transistor due to the creation of a tensile strain so that a smaller drain current can be obtained, as illustrated by curve 902'.

Therefore, applying a positive voltage between the electrodes 702, 703 may improve the performance of the transistor 811 in embodiments wherein the transistor 811 is an N-channel transistor, and applying a negative voltage between the electrodes 702, 703 may improve the performance of the transistor 811 in embodiments wherein the transistor 811 is a P-channel transistor.

In some embodiments, the voltage applied between the electrodes 702, 703 may have an absolute value in a range from about 3 V to about 6 V, for example, an absolute value of about 5 V. For a piezoelectric material of the piezoelectric layer 201 having a piezoelectric coefficient $d_{33}$ of about $200 \times 10^{-12}$ As/N, which may be obtained, for example, in embodiments wherein the piezoelectric material of the piezoelectric layer 201 includes lead zirconate titanate, an absolute value of the voltage applied between the electrodes

702, 703 of about 5 V may be sufficient to obtain about 1% strain if the distance between the electrodes 702, 703 is about 100 nm. In embodiments wherein the semiconductor layer 401 includes silicon, 1% strain may correspond to a stress of about 1.7 GPa, which may lead to an improvement of the charge carrier mobility by about 80%, corresponding to an increase of the ON-current of the transistor 811 by about 40%.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor-on-insulator wafer, comprising:
   a support substrate, said support substrate having an upper surface;
   an electrically insulating layer positioned over and covering substantially an entirety of said upper surface of said support substrate, said electrically insulating material comprising:
      a first buffer layer covering substantially said entirety of said upper surface of said support substrate;
      a layer of a piezoelectric material covering substantially an entirety of said first buffer layer; and
      a second buffer layer covering substantially an entirety of said layer of said piezoelectric material, wherein said layer of said piezoelectric material is positioned between said first and second buffer layers; and
   a semiconductor layer positioned over and covering substantially an entirety of said electrically insulating layer.

2. The semiconductor-on-insulator wafer of claim 1, wherein said piezoelectric material is a ferroelectric material.

3. The semiconductor-on-insulator wafer of claim 2, wherein said ferroelectric material comprises at least one of lead zirconate titanate, lanthanum doped lead zirconate titanate and an oxide comprising at least one of hafnium and zirconium.

4. The semiconductor-on-insulator wafer of claim 3, wherein said ferroelectric material comprises silicon-doped hafnium dioxide.

5. The semiconductor-on-insulator wafer of claim 1, wherein said support substrate comprises a semiconductor support wafer having said upper surface.

6. The semiconductor-on-insulator wafer of claim 1, wherein said first buffer layer comprises a first dielectric insulating material and said second buffer layer comprises a second dielectric insulating material.

7. A method, comprising:
   providing a first wafer and a second wafer;
   forming an electrically insulating layer over said first wafer, said electrically insulating layer comprising a layer of a first material that is suitable for forming a piezoelectric layer;
   implanting ions through said electrically insulating layer and into a portion of said first wafer below said electrically insulating layer, said implanted ions defining a splitting position of said first wafer;
   bonding said first wafer to said second wafer, wherein said electrically insulating layer is arranged between said first wafer and said second wafer; and
   splitting said first wafer at said splitting position of said first wafer, a portion of a semiconductor material of said first wafer that remains bonded to said second wafer providing a semiconductor layer at a side of said electrically insulating layer opposite said second wafer;
   wherein a piezoelectric layer positioned between said semiconductor layer and said second wafer is formed on the basis of said layer of said first material.

8. The method of claim 7, wherein said first material that is suitable for forming said piezoelectric layer is a material that is suitable for forming a ferroelectric layer, said piezoelectric layer being a ferroelectric layer.

9. The method of claim 8, wherein said material that is suitable for forming said ferroelectric layer comprises a substantially amorphous oxide comprising at least one of hafnium and zirconium.

10. The method of claim 8, wherein said material that is suitable for forming said ferroelectric layer comprises silicon-doped hafnium dioxide.

11. The method of claim 8, wherein said material that is suitable for forming said ferroelectric layer comprises at least one of lead zirconate titanate and lanthanum doped lead zirconate titanate.

12. The method of claim 7, further comprising:
   forming a capping layer over said layer of said first material;
   annealing said first wafer in the presence of said capping layer, wherein said annealing of said first wafer forms said piezoelectric layer from said layer of said first material; and
   removing said capping layer;
   wherein said forming of said capping layer, said annealing of said first wafer and said removing of said capping layer are performed before said bonding of said first wafer to said second wafer.

13. The method of claim 7, wherein said forming of said electrically insulating layer comprises:
   forming at least one of a first buffer layer between said first wafer and said layer of said first material, wherein said first buffer layer covers substantially an entirety of said first wafer and wherein said layer of said first material covers substantially an entirety of said first buffer layer; and
   forming a second buffer layer that covers substantially an entirety of said layer of said first material, said layer of said first material being positioned between said first and second buffer layers.

14. A semiconductor structure comprising a transistor, the transistor comprising:
   an electrically insulating layer positioned over a support substrate, said electrically insulating material comprising:
      a first buffer layer comprising a first dielectric insulating material;
      a second buffer layer comprising a second dielectric insulating material;

a third layer positioned between said first and second buffer layers, said third layer comprising a piezoelectric material;

a semiconductor layer positioned over said electrically insulating layer;

a source region, a channel region and a drain region positioned in said semiconductor layer;

a gate structure positioned over said channel region;

a first electrode and a second electrode positioned at laterally opposite sides of said electrically insulating layer; and a trench isolation structure between said first electrode and said semiconductor layer and between said second electrode and said semiconductor layer, said first and second electrodes being electrically insulated from said semiconductor layer and configured for applying a voltage to said piezoelectric material of said electrically insulating layer, wherein said piezoelectric material is adapted to create a strain at least in said channel region in response to said voltage applied thereto.

15. The semiconductor structure of claim 14, wherein said piezoelectric material is a ferroelectric material.

16. The semiconductor structure of claim 15, wherein said ferroelectric material comprises at least one of lead zirconate titanate, lanthanum doped lead zirconate titanate and an oxide comprising at least one of hafnium and zirconium.

17. The semiconductor structure of claim 14, wherein each of said first electrode and said second electrode comprises a semiconductor material.

18. The semiconductor structure of claim 17, wherein each of said first electrode and said second electrode further comprises a silicide.

19. The semiconductor structure of claim 14, wherein said transistor further comprises a raised source region over said source region and a raised drain region over said drain region.

20. A method, comprising:
providing a semiconductor-on-insulator wafer comprising a support substrate, an electrically insulating layer over said support substrate and a semiconductor layer over said electrically insulating layer, said electrically insulating layer comprising a layer of a piezoelectric material;

forming a trench isolation structure comprising a first trench and a second trench;

forming a gate structure between said first trench and said second trench;

removing first portions of said electrically insulating layer and said semiconductor layer at a side of said first trench opposite said gate structure, wherein a first recess is formed, and removing second portions of said electrically insulating layer and said semiconductor layer at a side of said second trench opposite said gate structure, wherein a second recess is formed; and forming a first electrode in said first recess and a second electrode in said second recess.

21. The method of claim 20, wherein said forming of said first electrode and said second electrode comprises performing an epitaxial growth process wherein a semiconductor material is deposited in said first recess and in said second recess.

22. The method of claim 21, wherein said epitaxial growth process additionally deposits said semiconductor material over a portion of said semiconductor layer between said gate structure and said first trench and over a portion of said semiconductor layer between said gate structure and said second trench, wherein a raised source region and a raised drain region are formed.

23. The method of claim 22, further comprising performing an annealing process and a silicidation process after said epitaxial growth process.

24. The method of claim 23, further comprising forming an interlayer dielectric, a first electrode contact and a second electrode contact, said first electrode contact extending through said interlayer dielectric and providing an electrical connection to said first electrode, said second electrode contact extending through said interlayer dielectric and providing an electric contact to said second electrode.

25. The method of claim 20, wherein said piezoelectric material is a ferroelectric material, said ferroelectric material comprising at least one of lead zirconate titanate, lanthanum doped lead zirconate titanate and an oxide comprising at least one of hafnium and zirconium.

26. A method, comprising:
providing a semiconductor structure comprising a transistor, said transistor comprising:
an electrically insulating layer comprising a piezoelectric material formed over a support substrate;
a semiconductor layer formed over said electrically insulating layer;
a source region, a channel region and a drain region formed in said semiconductor layer;
a gate structure formed over said channel region; and
a first electrode and a second electrode formed at laterally opposite sides of said electrically insulating layer, said first and second electrodes being electrically insulated from said semiconductor layer by a trench isolation structure formed between said semiconductor layer and said first and second electrodes; and applying a voltage between said first electrode and said second electrode, wherein said piezoelectric material creates a strain at least in said channel region in response to said voltage, said strain in said channel region modifying a charge carrier mobility in said channel region.

* * * * *